United States Patent [19]
Kwon

[11] Patent Number: 6,058,048
[45] Date of Patent: May 2, 2000

[54] FLASH MEMORY DEVICE USED AS A BOOT-UP MEMORY IN A COMPUTER SYSTEM

[75] Inventor: Suk-Chun Kwon, Kyunggi-do, Rep. of Korea

[73] Assignee: Samsung Electronics, Co., Ltd., Suwon, Rep. of Korea

[21] Appl. No.: 09/372,345

[22] Filed: Aug. 11, 1999

[30] Foreign Application Priority Data

Aug. 11, 1998 [KR] Rep. of Korea ............ 98-32514
Jul. 7, 1999 [KR] Rep. of Korea ............ 99-27255

[51] Int. Cl.[7] .................. G11C 16/04; G11C 7/00
[52] U.S. Cl. ............................ 365/185.33; 365/226
[58] Field of Search ............ 365/185.33, 185.04, 365/226, 228

[56] References Cited

U.S. PATENT DOCUMENTS 5,301,161 4/1994 Landgraf et al. ............ 365/229
5,438,549 8/1995 Levy ............................ 365/229
5,896,338 4/1999 Landgraf et al. ............ 365/226

*Primary Examiner*—Son Mai
*Attorney, Agent, or Firm*—Marger Johnson & McCollom, P.C.

[57] ABSTRACT

The disclosed is a nonvolatile semiconductor memory device which is employed in a system as a boot-up data storage component. The device includes a detection circuit for detecting a current level of a power supply voltage and for generating a detection signal. The detection signal is applied to the row and column selecting circuits, thus initiating an address designating memory cells that stores boot-up data. The boot-up data is then output.

15 Claims, 4 Drawing Sheets

FLASH MEMORY DEVICE USED AS A BOOT-UP MEMORY IN A COMPUTER SYSTEM

FIELD OF THE INVENTION

The present invention is in the field of semiconductor memory devices, and is more specifically related to a flash memory adapted for use as a boot-up memory component in a computing system.

BACKGROUND OF THE INVENTION

Nonvolatile flash memories (e.g., NAND-type flash EEPROMs), are used in various applications, such as portable computers (or notebook computers), hand-held sets (e.g., cellular phones), and palm top computers. Flash memories are important components also in the field of media technology, for instance in answering machines recording voice with audio information, and digital still cameras producing video information.

As flash memories are adaptable to their own interfacing forms different from those of other kinds of memories such as DRAMs and SRAMs, it is necessary to adapt them for use in such systems. In the flash memories, address signals and input/output data signals are transferred through a plurality of pins. And the flash memories should receive command signals that distinguish signals into addresses, data, or commands.

A general flash memory shown in FIG. 1 has row address buffer 10, row decoder 20, column address buffer 30, column decoder 40, memory cell array 50, page buffer 60, column gate circuit 70, and data output buffer 80. Row address buffer 10 and row decoder 20 receive and store external row address XRA, and apply the latched row address to memory cell array 50 after decoding it. Column address buffer 30 and column decoder 40 receive and store external column address XCA, and apply the latched column address to column gate circuit 70 after decoding it. Memory cell array 50 is formed of a plurality of memory cells constructing a plurality of strings (e.g., NAND string in a NAND-type flash memory), in which a plurality of word lines and bit lines are arranged in a matrix form. The memory cells are arranged at intersections of rows and columns. Page buffer 60 detects and stores data signals read from the memory cells, or data signals to be stored in the memory cells identified be the addresses. Column gate circuit 70, also known as Y-Gate circuit, transfers the data held in page buffer 60 to data output buffer 80 in response to the column address. Data output buffer 80 outputs the data supplied from page buffer 70 through input/output pins.

An operation of the device of FIG. 1, is shown in FIG. 2. The suffix "B" of a signal name denotes the signal activates in negative logic for example, CEB stands for "CE-bar". As control signals CEB, WEB and CLE go to their activation levels, a command signal, e.g., 00h, informing a read mode is invited via input/output pins I/O (not shown) thereto. Next, when control signal ALE goes to high level, the row and column address are applied thereto through input/output pins in synchronization with control signal WEB.

After completing the receiving operation with the read command signal and addresses, control signal R/BB falls to low level from high level, so as to put the device into a busy state, in which data of memory cells are read out and stored in the page buffer 60. When signal R/BB goes to high level from the low level, the device is placed into a ready state, and the detected data is applied to the outside of the device. It can be seen that the flash device does not perform its read-out operation until the command signal and addresses are invited thereto.

In adapting the flash memory device for use with a boot-up memory component, there is a problem. For example, for a personal computer, a boot-up memory should have a primary function of supplying pre-programmed boost-up data (i.e., firmware) relevant to an established system information or BIOS configurations therein, when the system is powered up. Since a central processor unit of a computer system does not actually operate before a predetermined firmware with the boost-up memory, prior art systems are generally designed to be automatically initiated by the boot-up memory. This permits the boot-up memory to have a simple interfacing configuration. However, the flash memory of FIG. 1 demands the corresponding control signals (or strobe signals) before the input of the command and address signals. As such, the flash memory at FIG. 1 is not compatible with the boot-up procedure of prior art devices, even though it would have functional advantages as the boot-up storage component in a computing system.

SUMMARY OF THE INVENTION

The present invention solves the problem of the prior art.

Generally the invention provides a semiconductor memory device that includes a memory cell array having a plurality of memory cells arranged in rows and columns. Boot-up data is also stored in the memory. The invention also includes a power detecting circuit for generating a first detection signal, when a power supply voltage is less than a predetermined detection voltage. It also includes address generating means for internally producing an address in response to the first detection signal, and a read circuit for reading data as boot-up data from the memory cell array in response to the internally generated address.

After boot-up, the memory device functions normally, by receiving externally applied row and column addresses.

In accordance with another aspect of the invention, there is provided a method for reading boot-up data stored in a flash memory device of a system when a power supply voltage is applied to the system. The method comprises the step of generating initial address inside the memory device, when the power supply voltage is less than a predetermined detection voltage; and the step of sensing the boot-up data depending on the internally generated initial address when the power supply voltage reaches the predetermined detection voltage.

The invention provides the capability of using the flash memory to read boot-up data for the whole computer system, and having a simple interfacing configuration when it is employed in a computing system as a boot-up storage component. These and other features and advantages of the invention will be better understood in connection with the accompanying Detailed Description and Drawings.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like of corresponding parts.

DESCRIPTION OF THE PREFERRED EMBODIMENT

Hereinbelow, applicable embodiments of the invention are described with reference to the appended drawings.

Figure 1:
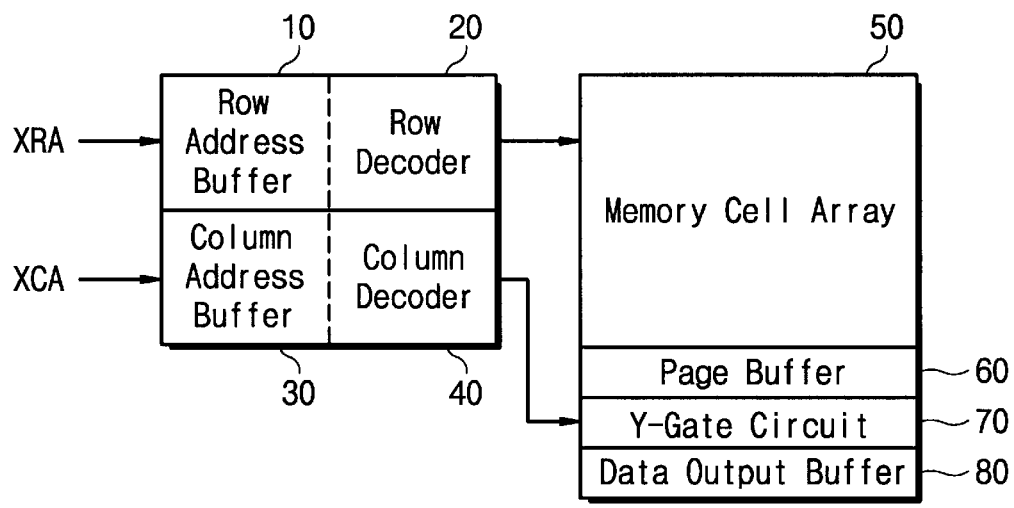
FIG. 1 is a block diagram of a conventional flash memory device.
Figure 2:
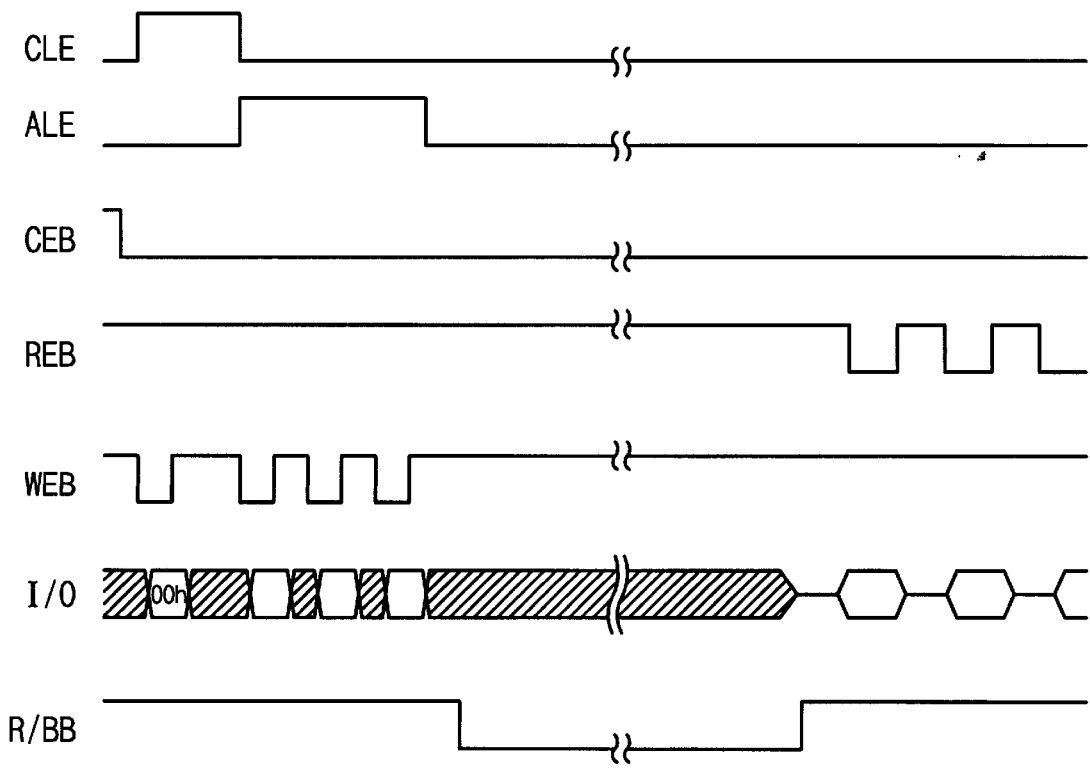
FIG. 2 is a timing diagram for the device of FIG. 1.
Figure 3:
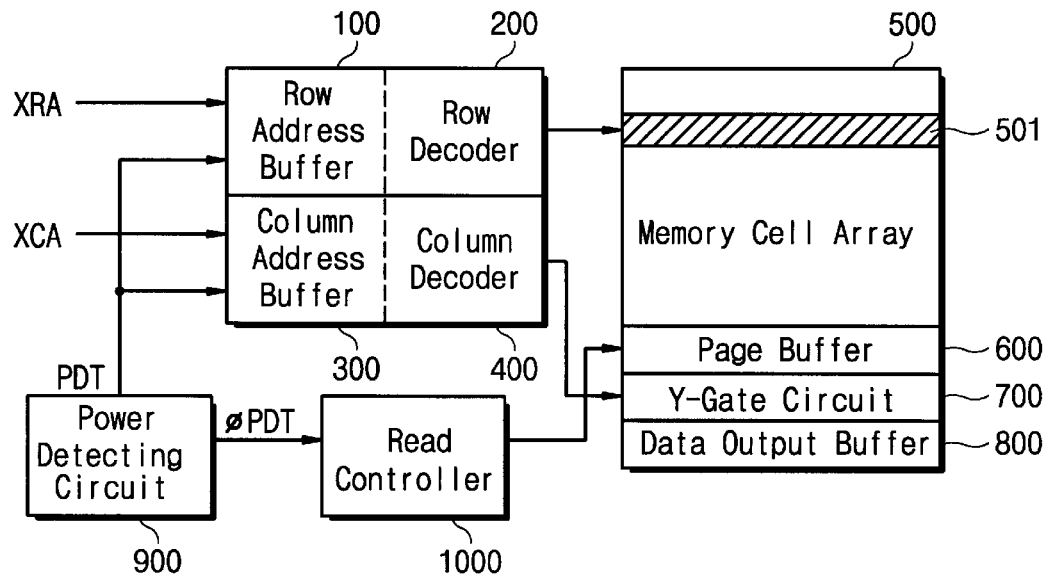
FIG. 3 is a block diagram of a flash memory device made according to the invention.

Referring to FIG. 3, a flash memory device of the invention is constructed of row address buffer 100, row decoder 200, column address buffer 300, column decoder 400, memory cell array 500, page buffer 600, column gate circuit 700, data output buffer 800. They are similar to similarly named components of FIG. 1.

In addition, the flash memory device of the invention includes a power detecting circuit 900 and a read controller 1000. These trigger the memory to read out boot-up data during power up.

More specifically, power detecting circuit 900 of the invention detects whether power supply voltage used in the flash memory device is less than a predetermined detection voltage, and generates the first detection signal PDT as detection result. In particular, when power supply voltage is less than the predetermined detection voltage, power detecting circuit 900 generates the first detection signal PDT following the power supply voltage. When power supply voltage reaches the predetermined detection voltage level, the first detection signal PDT goes to a ground voltage level, and the power detecting circuit 900 also generates a second detection signal φPDT, preferably in the form of a pulse.

When the first detection signal PDT following the power supply voltage is applied in common to the row address buffer 100 and the column address buffer 300, the buffers 100 and 300 generate initial row and column addresses internally. These initial row and column addresses cause memory cell array 500 to read out boot-up data (or firmware) without receiving external row and column addresses XRA and XCA. As a result, the row and column address buffers 100 and 300 are designed so as to make initial row and column addresses be set at an application of the first detection signal PDT following power supply voltage. And, they are designed so as to make external addresses receive for normal read/write when power supply voltage is higher than the predetermined detection voltage.

The initial row address which is set under the control of the first detection signal PDT, is transferred to the memory cell array 500 via the row decoder 200 so as to select memory sector (or memory block) storing the boot-up data. Also, the column decoder 400 decodes the initial column address generated in the column address buffer 300, and then transfers the decoded column address signals to column gate circuit 700.

The column gate circuit 700, being coupled between page buffer 600 and data output buffer 800, transfers data read out from a memory sector of memory cell array 500. And, the read controller 1000 is activated by the second detection signal φPDT of a pulse from power detecting circuit 900, and then controls sensing operation of the page buffer 600. Although not shown in figure, the read controller 1000 performs control operation associated with read operation. The page buffer 600 senses data stored in memory cells of a row corresponding to the initial row address, under the control of the read controller 100, and then temporarily stores data thus sensed.

Assuming that memory cell array 500 has boot-up sector 501 which stores boot-up firmware information of the host system, the initial row address selects a word line of the boot-up sector 501, and the initial column address make column gate circuit 700 transfer the data from the boot-up sector 501 to data output buffer 800 from page buffer 600.

In this embodiment, row address buffer 100, row decoder 200, column address buffer 300, column decoder 400, and page buffer 600 constitute a read circuit. And, as set forth above, the row and column address buffers 100 and 300 serve as address generating means during read operation of the boot-up data.

Figure 4:
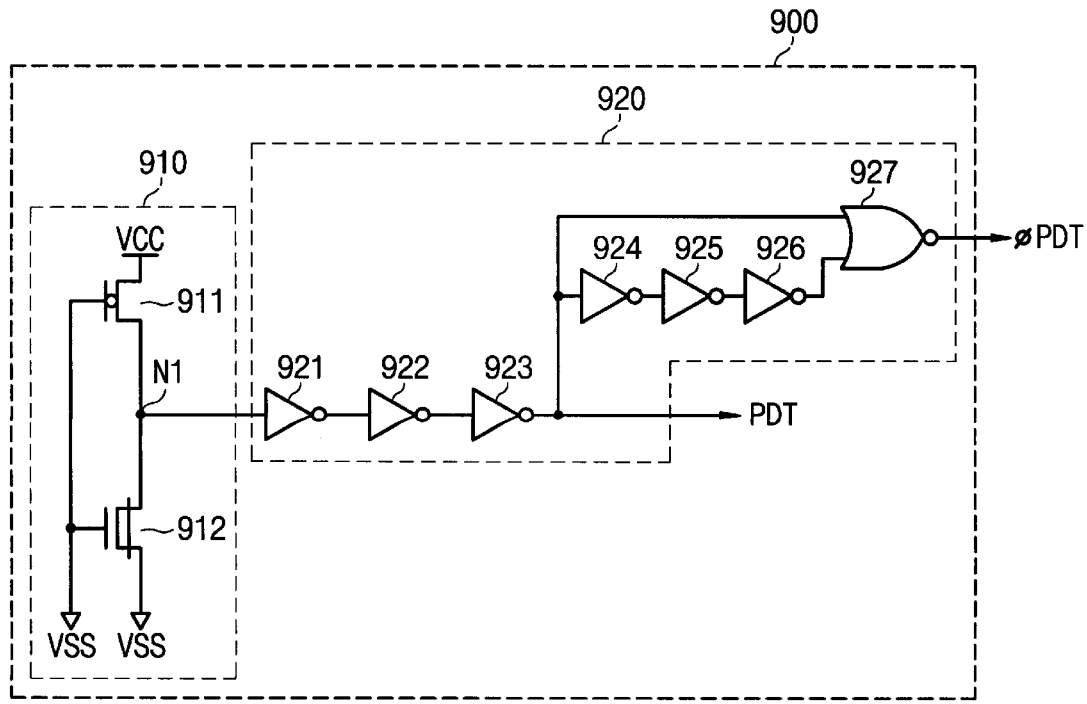
FIG. 4 is a detail circuit diagram of a power detecting circuit of FIG. 3.

FIG. 4 shows an embodiment of the power detection circuit 900. Referring to FIG. 4, the power detection circuit is formed of power supply voltage detection part 910 and detection signal generation part 920.

In voltage detection part 910, PMOS transistor 911 is connected between supply voltage terminal VCC and detection node N1, and NMOS depletion transistor 912 is connected between detection node N1 and substrate voltage terminal VSS (or ground voltage terminal). Gates of the PMOS and NMOS depletion transistors, 911 and 912, are coupled to VSS in common.

In generation part 920, power detection signal PDT is generated from detection node N1 through three inverters 921 to 923 that are connected serially. Detection pulse φPDT appears at the output of NOR gate 927, one input of which is directly connected to detection signal PDT, and the other input of which is connected to detection signal PDT through serially connected inverters 924 to 926. NOR gate 927 and inverters 924 to 926 construct a short pulse generating circuit. The voltage at detection node N1, i.e., the detection voltage, is determined by a current level of VCC, and the ratio of channel resistance between PMOS transistor 911 and NMOS depletion transistor 912.

Now, an explanation about the operating sequence of the present flash memory as the boot-up device will be given in conjunction with the flow chart of FIG. 5 and the timing diagram of FIG. 6. It should be noted that the flash memory device of the embodiment of the invention performs a boot-up memory function in addition to the usual read/write operations. These are performed after the boot-up function.

Figure 5:
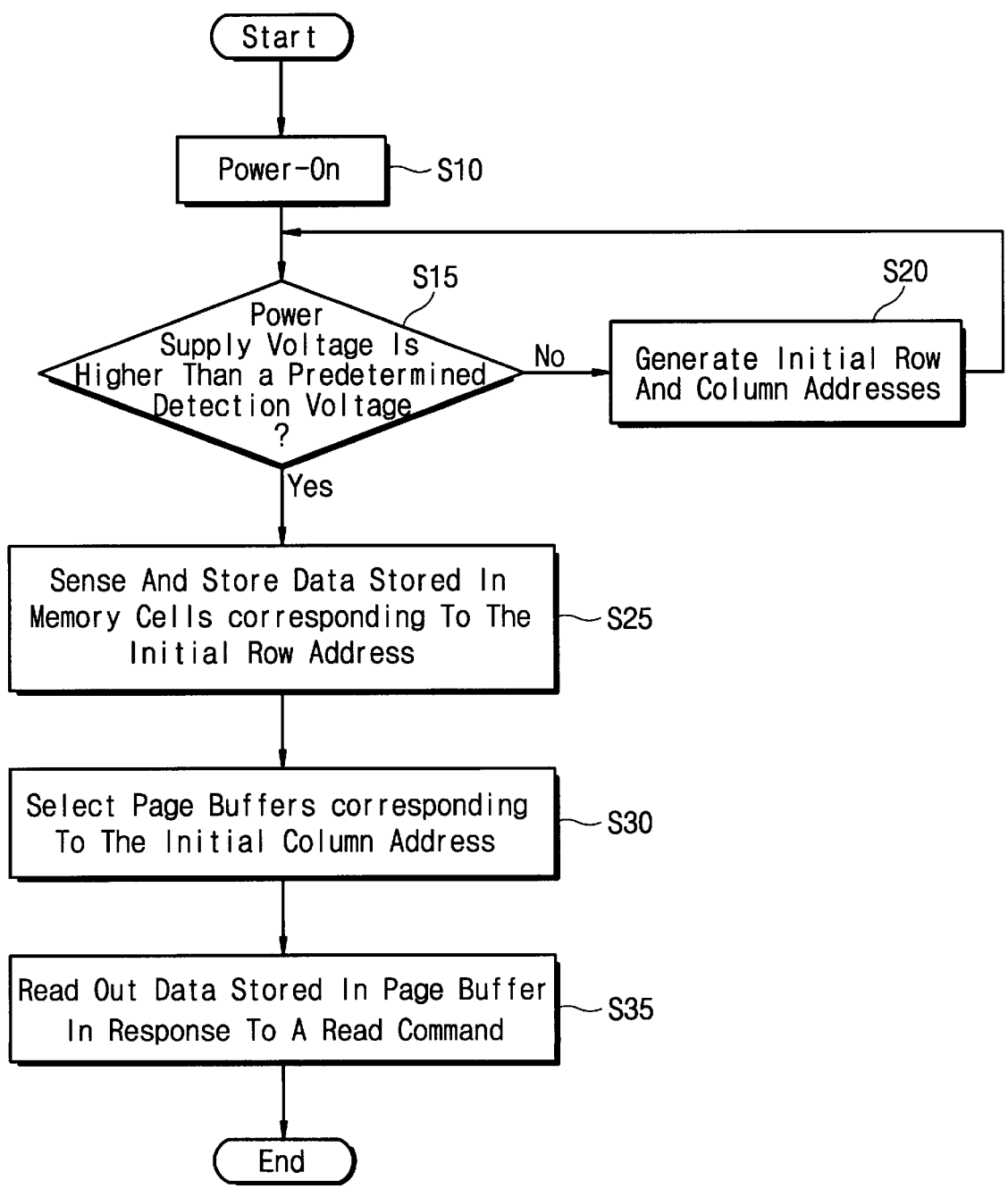
FIG. 5 is a flow chart showing a functional operation of the device of FIG. 3.

Referring to FIG. 5, the operating steps for performing the boot-up function are accomplished by applying power supply voltage to flash memory device (S10), and detecting whether power supply voltage is less than detection voltage or not (S15). While it is less, initial row and column addresses are generated in accordance with the first detection signal PDT (S20).

When the power supply voltage reaches the detection voltage, data stored in the memory cells that corresponds to the initial row address is sensed on the second detection signal φPDT (S25). Page buffers are selected corresponding to the initial column address, and the boot-up data is read out from the page buffer in response to a read command.

Figure 6:
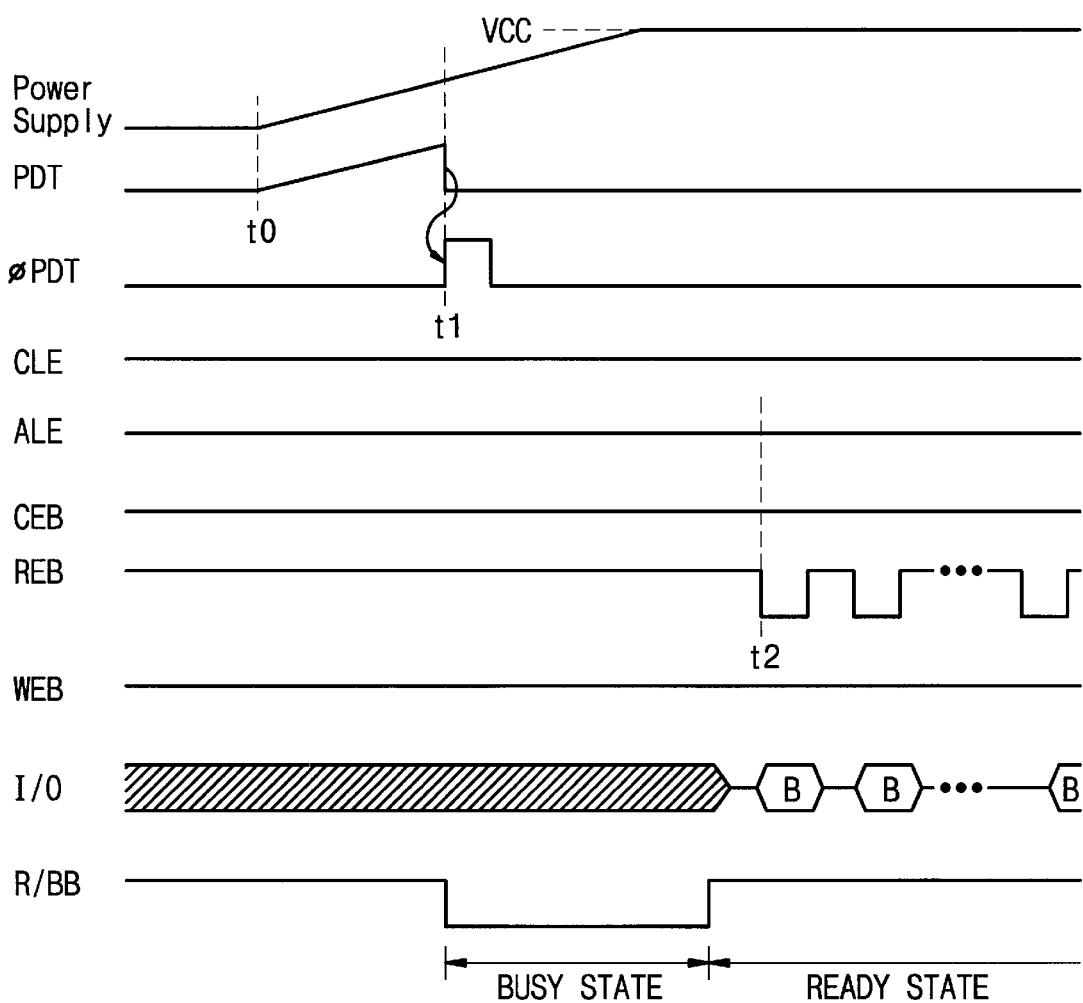
FIG. 6 is a timing diagram of the device of FIG. 3.

At step S10, a gradually increasing power supply voltage, as shown in FIG. 6, is applied to the power supply voltage terminal VCC of the power detecting circuit 900. The first detection signal PDT follows (also known as tracks) the varying level of the VCC from the power-up time t0 of FIG. 6.

During step S15, the current level of the power supply voltage is determined at node N1. In the circuit of FIG. 4, PMOS transistor 911 supplies charges corresponding to the current power supply voltage to detection node N1, and NMOS depletion transistor 912 discharges these charges to VSS. Therefore, the level of the detection voltage at node N1 would be influenced by the channel width of NMOS depletion transistor 912. If the power supply voltage, which has been increased after the power-up at time t0 of FIG. 6, does not reach a value higher than the discharging potential of NMOS depletion transistor 912, i.e., if the VCC level is lower than the detection voltage at node N1, then there are no charges on node N1, which causes the first detection signal PDT to be at a non zero level, and causes the second detection signal φPDT to be held at a low level.

Then, at step S20, initial row and column addresses are generated from the row and column address buffers 100 and 300 in accordance with the first detection signal PDT which follows the power supply voltage. The initial row address thus generated is supplied to a corresponding word line of boot-up sector 501 via the row decoder 200. That is, there is selected a word line coupled to memory cells storing the boot-up data.

As the power supply voltage reaches the detection voltage, the first detection signal PDT has a high-to-low transition, while the second detection signal φPDT is pulsed from low level to high level in accordance with low transition of the signal PDT. The pulse width of the second detection signal φPDT can be adjusted by changing the number of the inverters 924 to 926.

At following step S25, the read controller 1000 controls page buffer 600 in response to the second detection signal φPDT so as to perform its sensing operation. This makes the page buffer 600 sense boot-up data stored in memory cells of a row (or page) corresponding to the initial row address, and temporarily store the boot-up data thus sensed.

Subsequently, the initial column address generated at the step S20 is transferred to the column gate circuit 700 via the column decoder 400, so that page buffers corresponding to the initial column address are selected, which store a part of the sensed boot-up data (S30). The boot-up data is substantially transferred to the data output buffer 800 through the column gate circuit 700.

At step S35, a read command signal REB (shown in FIG. 6) is invited thereto at time t2 after control signal R/BB goes to high level (i.e., ready state) from low level (i.e., busy state). Then the boot-up data (denoted by reference character B in FIG. 6) held in the data output buffer are output from the device through input/output pins I/O.

It might be understood that, from the power-up to the output of the boot-up data, the entire sequence of the operational steps are automatically performed therein, when there is the power-up and the subsequent voltage detection. And there is no need of receiving external strobe signals, such as ALE (address latch enable) and CLE (command latch enable), in order to permit addresses and commands to be introduced thereto. Since the automatic detection operation for a power supply voltage initiates the addressing, selecting and transferring of boot-up data stored in memory cells, the flash memory device according to the invention is more adaptable for use in a system as a boot-up storage component.

It will be understood that alternate naming is possible for the same components. For example, blocks 300, 400 and 700 of FIG. 3 can equivalently be called a column selection circuit. Further, different combinations of pulses and transitions can be used to activate the row address buffer and the column address buffer, so that they select the memory cells that contain the boot-up data.

While this invention has been described in connection with what is presently considered to be the most practical and preferred embodiment, it is to be understood that the invention is not limited to be disclosed embodiment, but, on the contrary, is intended to cover various modifications and equivalent arrangements included within the scope of the invention.

What is claimed is:

1. A flash memory device comprising:
   a memory cell array having a plurality of memory cells arranged in rows and columns;
   a power detecting circuit for generating a first detection signal when a power supply voltage is less than a predetermined detection voltage;
   address generating means for internally producing address in response to the first detection signal; and
   a read circuit for reading data from the memory cell array in response to the internally generated address.

2. The flash memory device according to claim 1, wherein the read circuit comprises:
   a row selecting circuit for selecting a row corresponding to row address of the internally generated address;
   a column selecting circuit for selecting columns corresponding to column address of the internally generated address;
   a page buffer circuit for sensing data stored in memory cells of the selected row; and
   a read controller for controlling a sensing operation of the page buffer circuit in response to a second detection signal,
   wherein the second detection signal is generated from the power detecting circuit when the power supply voltage reaches the predetermined detection voltage.

3. The flash memory device according to claim 2, wherein the power detecting circuit inactivates the first detection signal when the power supply voltage reaches the predetermined detection voltage.

4. The flash memory device according to claim 3, wherein the first detection signal tracks the power supply voltage while the power supply voltage is less than the predetermined detection voltage, and has a ground voltage when the power supply voltage reaches the predetermined detection voltage; and wherein the second detection signal is a pulse signal.

5. The flash memory device according to claim 4, further comprising a data output buffer circuit for outputting the sensed data by the page buffer circuit in response to a read enable signal.

6. The flash memory device according to claim 5, wherein the sensed data by the page buffer circuit is boot-up data.

7. The flash memory device according to claim 6, wherein the address generating means comprises:
   a row address buffer for generating the row address in response to the first detection signal; and
   a column address buffer for generating the column address in response to the first detection signal.

8. The flash memory device according to claim 7, wherein the row and column address buffers receive externally applied row and column addresses after the read operation associated with the boot-up data is ended.

9. A method for reading boot-up data stored in a flash memory device of a system when a power supply voltage is applied to the system, the method comprising:
   generating initial address inside the memory device when the power supply voltage is less than a predetermined detection voltage; and
   sensing the boot-up data depending on the internally generated initial address when the power supply voltage reaches the predetermined detection voltage.

10. The method according to claim 9, wherein the initial address is generated from an inner address buffer of the memory device.

11. The method according to claim 9, further comprising the step of outputting the sensed boot-up data in response to a read command signal.

12. The method according to claim 11, wherein normal read and write operations are performed depending on address provided externally to the memory device after the outputting step.

13. A data read method of a flash memory device which has memory cells arranged in rows and columns and which stores boot-up data, the data read method comprising:

generating at least one initial row address and at least one initial column address inside the memory device when a power supply voltage is less than a predetermined detection voltage;

sensing the boot-up data when the power supply voltage reaches the predetermined detection voltage, the boot-up data being stored in memory cells corresponding to the initial row address; and selecting page buffers corresponding to the initial column address.

14. The data read method according to claim 13, further comprising the step of outputting data stored in the selected page buffers in response to a read command signal.

15. The data read method according to claim 13, wherein the initial row and column addresses are generated from row and column address buffers of the memory device, respectively.

* * * * *